United States Patent

Hirshon et al.

[15] 3,678,346

[45] July 18, 1972

[54] SEMICONDUCTOR DEVICE AND METHOD OF MAKING THE SAME

[72] Inventors: Jack M. Hirshon, Doylestown; Philip D. Warner, Lansdale, both of Pa.

[73] Assignee: TRW, Inc.

[22] Filed: Nov. 10, 1964

[21] Appl. No.: 410,182

[52] U.S. Cl. ....................................317/234 R, 317/234 N

[51] Int. Cl. ....................................................H01l 1/14

[58] Field of Search ..................317/235, 234, 237; 29/25.3, 29/155.56 H, 155.56 I, 569–591

[56] References Cited

UNITED STATES PATENTS

| | | | |
|---|---|---|---|
| 3,324,014 | 6/1967 | Modjeska | 317/234 |
| 3,324,530 | 6/1967 | Sherwood et al. | 29/569 |
| 3,325,586 | 6/1967 | Suddick | 317/234 X |
| 3,331,125 | 7/1967 | McCusker | 317/235 X |

FOREIGN PATENTS OR APPLICATIONS

| | | | |
|---|---|---|---|
| 1,099,888 | 3/1955 | France | 317/234 |

*Primary Examiner*—Jerry D. Craig
*Attorney*—Donald C. Keaveney and Alfred B. Levine

[57] ABSTRACT

An electrical semiconductor device comprising a flat disc of a semiconductor material of one conductivity type having in one surface thereof an area of the opposite conductivity type to provide a P-N junction with the material of the disc. A protective oxide film covers the one surface of the disc and has two openings therethrough. One of the openings exposes at least a portion of the area of the opposite conductivity type and the other opening exposes a portion of the surface of the disc. A separate electrode of an electrically conductive metal is coated over each of the exposed portions of the disc and the area of the opposite conductivity type. A separate flat terminal strap of an electrically conductive metal having a length substantially greater than its width is secured at one end to each of the electrodes and extends a substantial distance beyond the edge of the disc. The terminal straps lie in a plane juxtaposed and parallel to the surface of the disc and are secured to their respective electrodes along a flat surface of the straps. Also, the straps are arranged so that they are not in alignment with each other. For a three terminal semiconductor device, such as a transistor, a third electrode is provided in a third opening in the oxide film and a third terminal strap is attached to the third electrode and extends beyond the edge of the disc. The third terminal strap is arranged so that it is not in alignment with either of the other two terminal straps.

The semiconductor device is made as part of a large flat wafer of the semiconductor material which contains a plurality of the semiconductor devices and which is cut or broken apart between the semiconductor devices to separate them. A surface of the wafer is coated with a protective oxide film, and the P-N junctions of the semiconductor devices are formed in the surface of the wafer through holes provided in the oxide film. After the P-N junctions are formed, the electrodes for the semiconductor devices are coated on the surface of the wafer through holes provided in the oxide layer. The terminal straps for all of the semiconductor elements are then simultaneously formed and simultaneously bonded to their respective electrodes. The terminal straps may be formed separate from the wafer and then bonded to the electrodes or they may be formed directly on the wafer.

3 Claims, 12 Drawing Figures

INVENTORS.
JACK M. HIRSHON
PHILIP D. WARNER
BY Donald S. Cohen
ATTORNEY

INVENTORS.
JACK M. HIRSHON
PHILIP D. WARNER

BY Donald S. Cohen
ATTORNEY

INVENTORS.
JACK M. HIRSHON
PHILIP D. WARNER
BY [signature]
ATTORNEY

INVENTORS.
JACK M. HIRSHON
PHILIP D. WARNER
BY
ATTORNEY

SEMICONDUCTOR DEVICE AND METHOD OF MAKING THE SAME

Presently, junction type semiconductor devices, such as transistors or diodes, are generally made by forming in a single wafer of a semiconductor material, such as silicon or germanium, the junctions of a plurality of the devices. The wafer is then cut or broken apart to form the individual devices. The individual devices are then mounted in a housing, or, when used as part of a microcircuit assembly, mounted on a substrate having a conductive circuit pattern thereon. When the device is mounted in a housing, the electrodes of the junctions of the device are electrically connected to terminals extending through the housing. When mounted on the substrate of a microcircuit assembly, the electrodes of the junctions are electrically connected to the conductive pattern on the substrate. The electrical connections to the electrodes of the junction of the device have generally been made by bonding a separate fine wire to each of the electrodes, and then bonding each of the wires to a terminal of the housing or a conductive pattern of the microcircuit assembly. Because of the extremely small size of these semiconductor devices and the fineness of the wire, the wires are individually bonded to each semiconductor device using special hand operated equipment. Thus, the terminating of the semiconductor devices has been a time-consuming and expensive operation.

It is an object of the present invention to provide a novel semiconductor device.

It is another object of the present invention to provide a novel termination for a semiconductor device.

It is still another object of the present invention to provide a termination for a semiconductor device which permits the semiconductor device to be electrically connected to the terminals of a housing on the circuit pattern of a microcircuit assembly with greater ease.

It is a further object of the present invention to provide novel methods of making semiconductor devices.

It is a still further object of the present invention to provide novel methods of applying terminals to semiconductor devices.

It is another object of the present invention to provide methods of simultaneously applying all the terminals to a semiconductor device.

It is still another object of the present invention to provide methods of simultaneously applying all of the terminals to a plurality of semiconductor devices.

Other objects will appear hereinafter.

The invention accordingly comprises the several steps and the relation of one or more of such steps with respect to each of the others, and the article possessing the features, properties, and the relation of elements, which are exemplified in the following detailed disclosure, and the scope of the invention will be indicated in the claims.

For a fuller understanding of the nature and objects of the invention, reference should be had to the following detailed description taken in connection with the accompanying drawings in which.

Figures 1, 2, 3, 4:
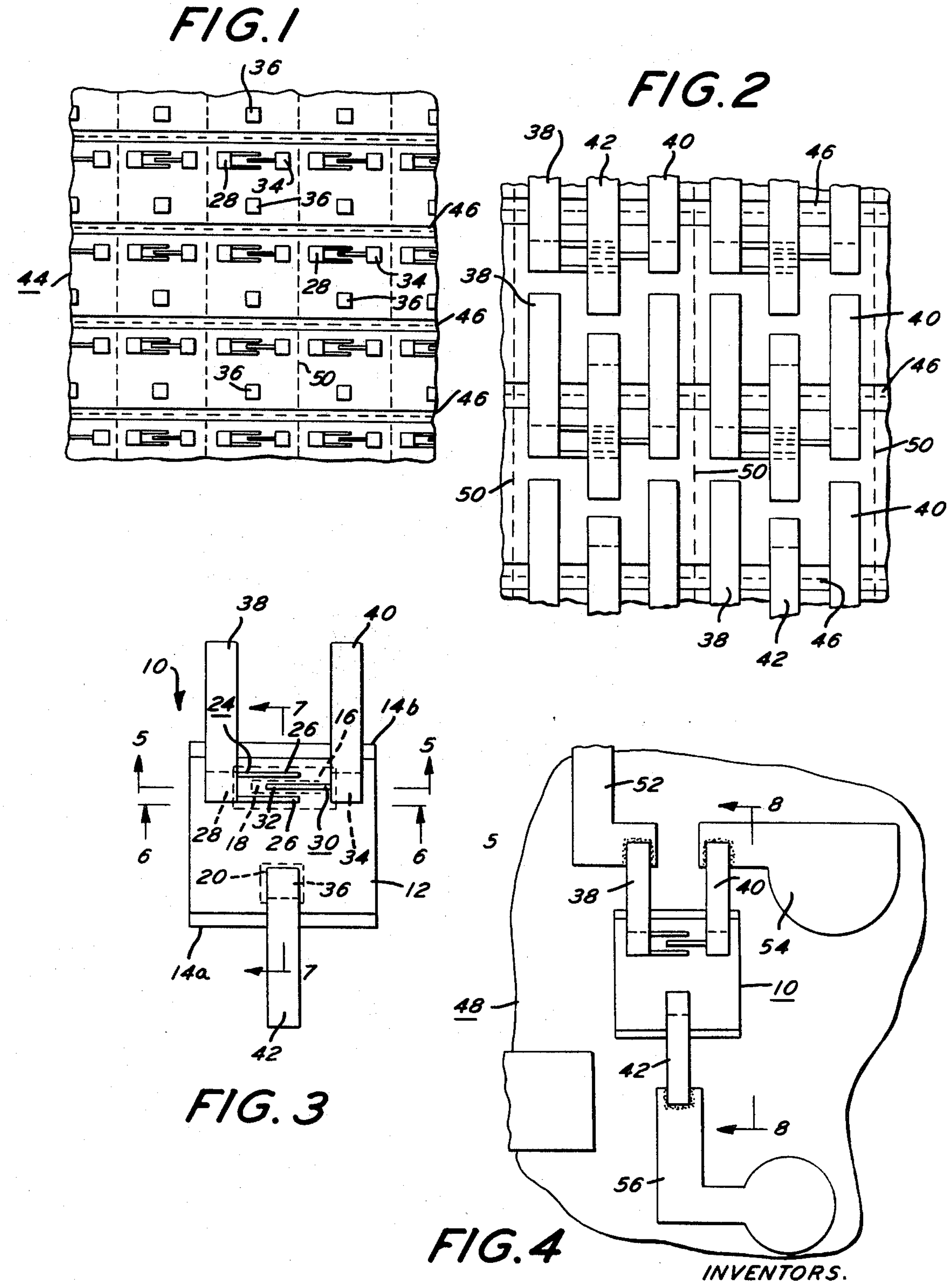
FIG. 1 is a top plan view of a portion of a wafer having a plurality of semiconductor devices formed therein but without the terminal straps attached thereto.
FIG. 2 is a top plan view of a portion of a wafer having a plurality of semiconductor devices formed therein and with the terminal straps attached thereto.
FIG. 3 is a top plan view of one of the completed semiconductor devices of the present invention.
FIG. 4 is a top plan view of a portion of a microcircuit assembly with a semiconductor of the present invention mounted thereon.
Figure 5:
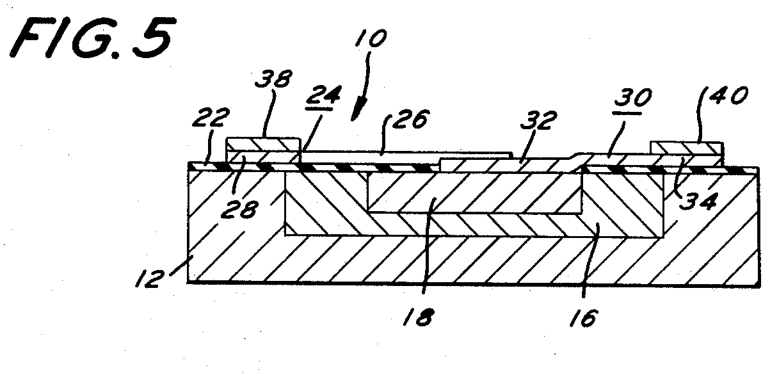
FIG. 5 is a sectional view taken along line 5—5 of FIG. 3.
Figure 6:
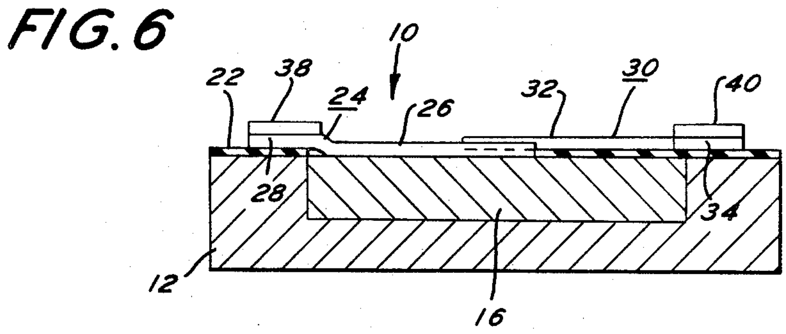
FIG. 6 is a sectional view taken along line 6—6 of FIG. 3.
Figure 7:
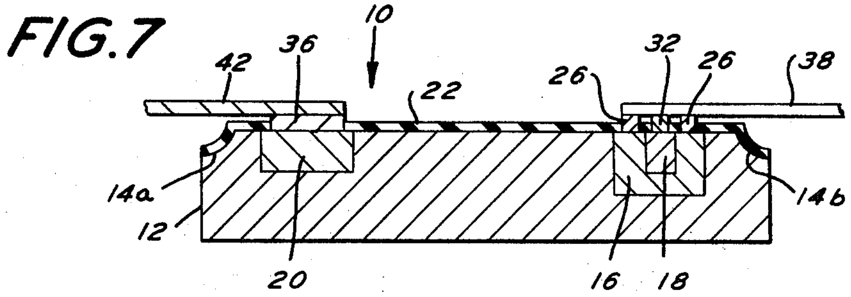
FIG. 7 is a sectional view taken along line 7—7 of FIG. 3.

Referring initially to FIGS. 3, 5, 6 and 7, the semiconductor device of the present invention, generally designated as 10, is shown as being in the form of a transistor. Transistor 10 comprises a thin, flat, square disc 12 of a semiconductor material, such as silicon or germanium of one conductivity type. The disc 12 may be as small as 0.010 inch on each side and 0.003 inch in thickness. Along two opposed sides of the disc 12, the edges at the top surface of the disc are chamfered by grooves **14*a* and 14*b* (see FIGS. 3 and 7). Adjacent the groove 14*b*, a rectangular shaped base area 16 is provided in the top surface of the disc 12. Within the base area 16, an emitter area 18 is provided in the top surface of the disc 12. Adjacent the groove 14*a* and midway along the length of the groove a collector contact area 20 is provided in the top surface of the disc 12. The base area 16 is of a conductivity type opposite to that of the disc 12. The emitter area 18 and collector area 20 are of the same conductivity type as that of the disc 12, but preferably more highly doped. Thus, for example, if the disc 12 is of N type semiconductor material, the bUse area 16 is of P type, and the emitter area 18 and collector area 20 are of N+ type. Likewise, if the disc 12 is of P type semiconductor material, the base area is of N type, and the emitter area and collector area are of P+ type. The base, emitter and collector areas may be formed by any of the techniques well known in the art, such as by diffusing into the disc 12** the proper impurities to provide the particular conductivity type.

The top surface of the disc 12 and the surface of the grooves **14*a* and 14*b* are coated with a thin protective layer 22 of silicon oxide. The protective layer 22 has openings therein over portions of each of the base area 16, emitter area 18 and collector area 20. A U-shaped base electrode 24 is provided on the top surface of the disc 12. The legs 26 of the base electrode 24 extend over the base area 16 on opposite sides of the emitter area 18 and contact the base area 16 through the openings in the protective layer 22 (see FIGS. 3, 6 and 7). The bottom 28 of the base electrode 24 is over the protective layer 22 at one end of the base area 16, and provides a terminal pad. A T-shaped emitter electrode 30 is provided on the surface of the disc 12. The leg 32 of the emitter electrode 30 extends over the emitter area 18 between the legs 26 of the base electrode 24, and contacts the emitter area 18 through an opening in the protective layer 22 (see FIGS. 3, 5 and 7). The head 34 of the emitter electrode 30 extends over the protective layer 22 at the other end of the base area 16, and provides a terminal pad. A collector electrode 36 is provided on the top surface of the disc 12 over the collector area 20, and contacts the collector area through an opening in the protective layer 22. The base electrode 24, emitter electrode 30 and collector electrode 36** are thin films of an electrically conductive metal, such as aluminum, gold, silver, nickel, copper, platinum, or alloys thereof.

Thin, flat, rectangular terminal straps 38, 40 and 42 of an electrically conductive metal, such as copper, are respectively bonded at one end of the base electrode terminal pad 28, the emitter electrode terminal pad 34 and the collector electrode 36. The terminal straps 38, 40 and 42 are all parallel, and lie in the same plane which is parallel to the top surface of the disc 12. Terminal straps 38 and 40 extend from the terminal pads 28 and 34 respectively over the groove **14*b* and project beyond the side of the disc 12. Terminal strap 42 extends from the collector electrode 36 over the groove 14*a* and projects beyond the opposite side of the disc 12**.

The method of the present invention for making the semiconductor device 10 shown in FIG. 3, in general, comprises forming in a relatively large, flat wafer 44 of the semiconductor material the junction area 16, 18 and 20 and the electrodes 24, 30 and 36 of a plurality of the semiconductor devices 10 (see FIG. 1). As shown in FIG. 1, the junction areas are arranged in uniform rows. The junction areas and electrodes can be formed in the wafer 44 by the basic method described in U.S. Letters Pat. No. 3,025,589 to J. A. Hoerni, issued Mar. 20, 1962, entitled "Method of Manufacturing Semiconductor Devices". This method includes coating one surface of the wafer 44 with a protective oxide layer in the manner described in said U.S. Pat. No. 3,025,589. Holes are etched through the oxide layer to expose the areas of the wafer 44 where the base junction areas 16 of the semiconductor elements 10 are to be provided. The base areas 16 are then formed by diffusing the proper impurity into the wafer 44, and the base areas 16 are then covered by a protective oxide layer. Holes are then etched through the oxide layer to expose the areas where the emitter junction areas 18 and collector contact areas 20 are to be provided. The emitter areas 18 and collector areas 20 are then formed by diffusing the proper impurity into the wafer 44. The emitter areas 18 and collector areas 20 are then coated with the protective oxide layer. Holes are then etched through the protective oxide layer over the portions of each of the junction areas 16, 18 and 20 where the electrodes 24, 30 and 36 are to make contact with the junction areas. The electrodes 24, 30 and 36 are then provided on the wafer 44 by any of the well known techniques for plating with a metal, such as by evaporation of the metal in a vacuum or by pyrolytically decomposing a gas containing the metal and depositing the metal on the wafer, or by electroplating. The desired shapes of the electrodes can be obtained by either applying the electrodes through a mask, or by coating the entire wafer with the metal and removing the undesired areas of the metal by any well known etching technique. Either before the original protective oxide layer is applied to the wafer or at some point in the operation prior to applying the final oxide layer, a plurality of parallel grooves 46 are cut in the surface of the wafer 44. The grooves 46 extend along lines between the adjacent rows of the collector contact areas 20 and the base and emitter junction areas 16 and 18. Thus, during the formation of these areas, the surfaces of the grooves are coated with the protective oxide layer.

At this point in the operation, the wafer 44 is of the construction and has the appearance shown in FIG. 1. The next step in the method of the present invention is attaching the terminal straps 38, 40 and 42 to the electrodes of all of the semiconductor devices 10 on the wafer 44 simultaneously. The terminal straps can be applied to all of the semiconductors by any of the specific methods which will be explained later. FIG. 2 shows the wafer 44 with all of the terminal straps attached thereto. Since each of the terminal straps extends beyond a side of its respective semiconductor device 10, each of the terminal straps will extend across a portion of the semiconductor device adjacent the semiconductor device to which the terminal strap is attached. However, since the terminal straps are all parallel and the collector terminal strap 42 extends along a line between the base terminal strap 38 and the emitter terminal strap 40, each of the terminal straps 42 will extend between the terminal straps 38 and 40 of the next adjacent semiconductor device. Thus, there is no contact between the terminal straps of adjacent semiconductor devices.

After the terminal straps are attached to the wafer 44, the wafer is diced to form the individual terminated semiconductor devices 10. To dice the wafer 44, two sets of grooves are scribed in the back surface of the wafer. The scribed grooves of one of the sets are directly opposed to the grooves 46 in the top surface of the wafer 44 as indicated by dash lines 48 in FIGS. 1 and 2. The scribed grooves of the other set are perpendicular to those of the first set and extend along the dash lines 50. Thus, each of the semiconductor devices 10 is delineated by the scribed grooves. The wafer 44 is then broken along the scribed grooves to separate the individual semiconductor devices 10. Thus, by the method of the present invention, the terminal straps are applied to a plurality of the semiconductor devices simultaneously while the semiconductor devices are a part of a relatively large wafer. This eliminates the individual handling of the small semiconductor devices and the individual bonding of the terminals to each of the electrodes of the semiconductor device so that the cost of manufacturing the semiconductor devices is greatly reduced.

Referring to FIGS. 9–12, there are shown various methods of the present invention for attaching the terminal straps to the electrodes of the semiconductor devices. In the method shown in FIG. 9, the wafer 44 is provided with the junctions and electrodes of the semiconductor devices in the manner previously described. The electrodes are coated with a layer of solder, such as by dip soldering. A sheet of metal from which the terminal straps are to be formed is bonded to a backing sheet of either glass or a plastic. Preferably, the backing sheet is of a transparent material for reasons which will be explained. The metal sheet may be bonded to the backing sheet by a suitable cement or, if a plastic backing sheet is used, by the application of heat and pressure. A layer of a resist material is coated on the areas of the metal sheet which are to be the terminal straps. The resist material may be applied to the metal layer through a suitable mask, or by using a photosensitive resist material which is activated only over the desired areas with the remaining material being washed away, both techniques being well known in the art. The uncoated area of the metal sheet is then etched away, and the resist removed from the remaining areas of the metal. This leaves on the backing sheet the terminal straps arranged in the desired pattern.

The backing sheet with the terminal straps thereon is then placed over the top surface of the wafer with the terminal straps contacting the wafer. By using a transparent backing sheet, the backing sheet can be positioned so that the proper end of each of the terminal straps is in contact with its proper electrode. The assembly is then heated to solder each of the terminal straps to its respective electrode. The backing sheet is then removed from the terminal straps. This can be achieved by means of a suitable solvent which softens or dissolves the cement which bonds the backing sheet to the terminal straps, or, if a plastic backing sheet is used, which dissolves the entire backing sheet. With the backing sheet removed, the wafer is then diced to separate the individual semiconductor devices in the manner previously described.

Figures 9, 10:
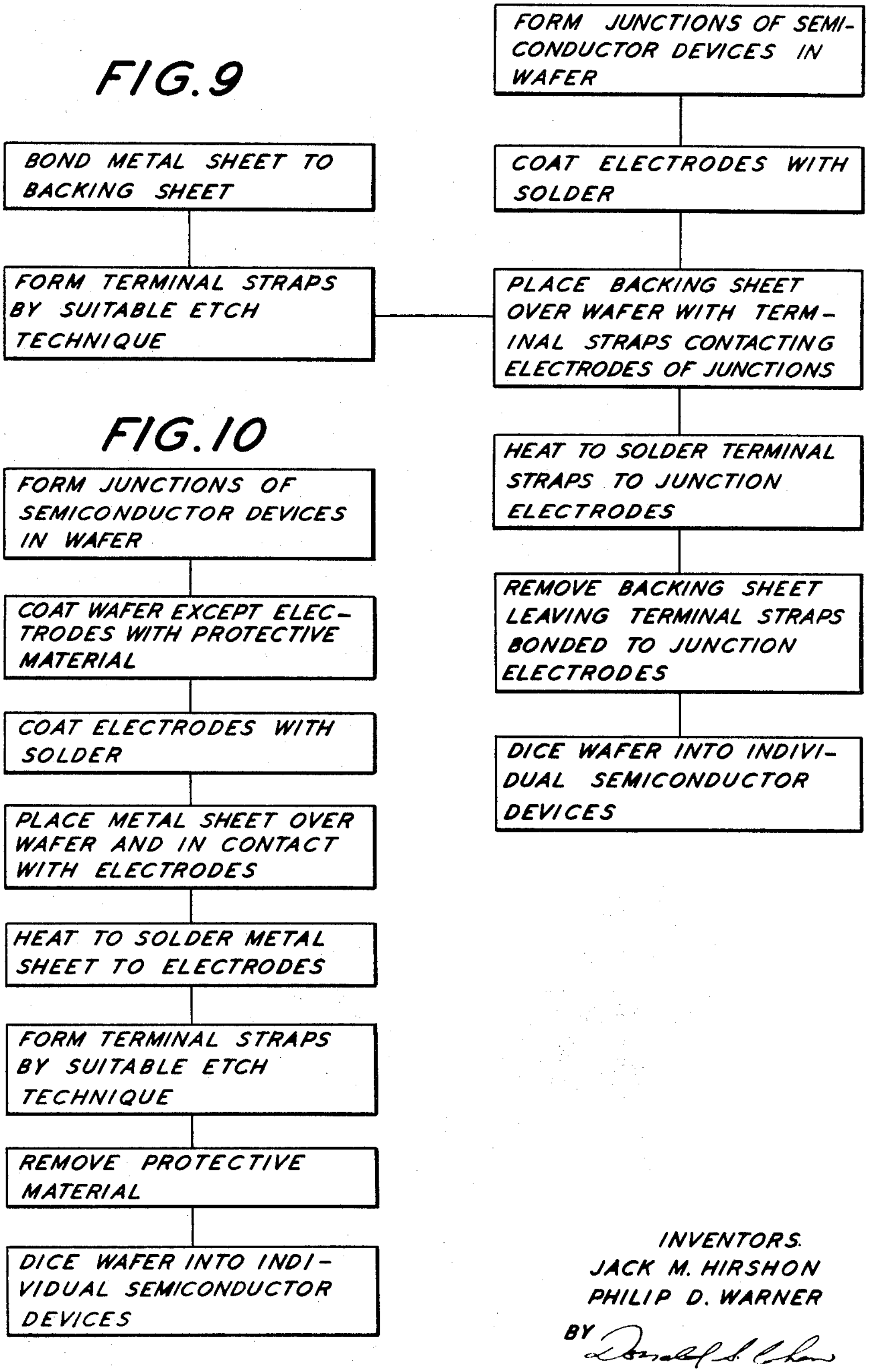
FIGS. 9–12 are flow charts of various modifications of the method of the present invention for making the semiconductor device of the present invention.

In the method shown in FIG. 10, the wafer 44 is provided with the junctions and electrodes of the semiconductor devices in the manner previously described. A suitable resist material is coated over the entire wafer except the areas of the electrodes to which the terminal straps are to be bonded, and the exposed areas of the electrodes are coated with a solder, such as by dip soldering. A sheet of metal from which the terminal straps are to be formed is placed over the top surface of the wafer 44 in contact with the solder coated electrodes. The assembly is heated to bond the metal sheet to the electrodes. A layer of a suitable resist material is coated over the areas of the metal sheet which are to be the terminal straps. The uncoated area of the metal sheet is then etched away, and the resist material covering the terminal straps and the wafer is removed. This provides the wafer 44 with the terminal straps attached thereto as shown in FIG. 2. The wafer is then diced to separate the individual semiconductor devices in the manner previously described.

Figure 11:
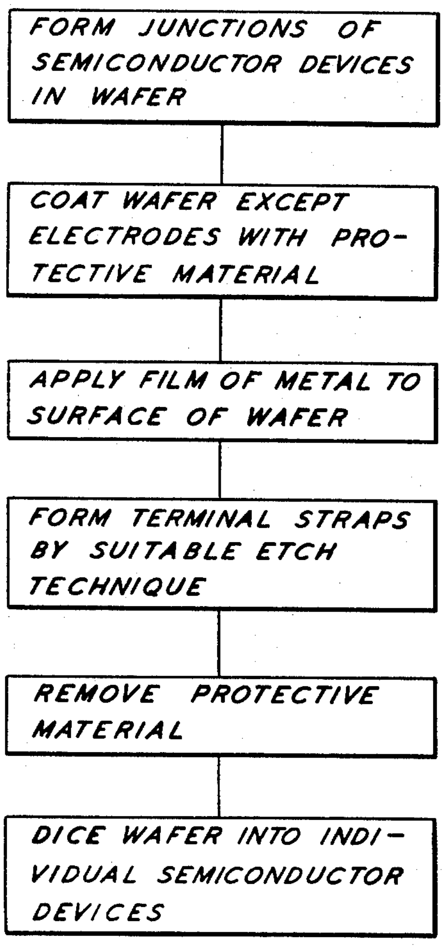

The method shown in FIG. 11 is the same as that shown in FIG. 10 described above except that no solder is applied to the electrodes, and instead of bonding a preformed sheet of metal to the resist coated wafer, a thin film of the metal is coated over the wafer. The metal film can be coated on the wafer either by evaporation of the metal in a vacuum or by pyrolytically decomposing a gas containing the metal and depositing the metal on the wafer, or by the well known process of electroless plating. After the wafer is coated with the metal film, the terminal straps are formed from the metal film by the same method described above with regard to the method of FIG. 10 for forming the terminal straps from the metal sheet. After the terminal straps are formed, the resist coatings are removed and the wafer is diced to separate the individual semiconductor devices. This method of making the semiconductor devices 10 of the present invention has the advantage over the methods shown and described with regard to FIGS. 9 and 10 in that it provides a direct connection between the terminal straps and the electrodes rather than a solder connection. The direct connection between the terminal straps and the electrodes not only provides a better electrical connection, but eliminates the chance that the connection will be broken because of the solder melting during the operation of the semiconductor device.

Figure 12:
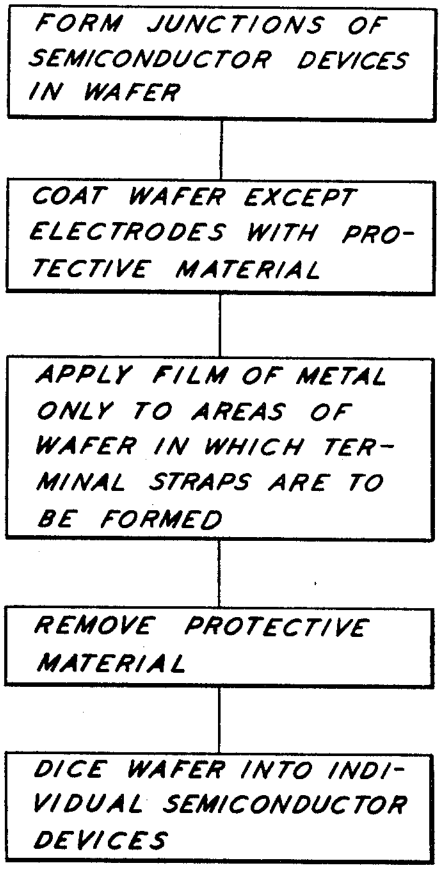

The method shown in FIG. 12 is identical to that shown in FIG. 11 except that the metal film is applied only to the areas of the protected wafer which are to be the terminal straps. When applying the metal film by either of the techniques of vacuum evaporation of the metal or pyrolytically decomposing a gas containing the metal, a suitable mask can be placed over the top surface of the wafer so that only the areas to be coated are exposed. The metal is then deposited on the wafer only over the areas of the terminal straps to provide the construction shown in FIG. 2. It is well known in the art that the process of electroless plating includes applying an activator material to the surface to be plated, and then applying the plating material to the activator material. To form the terminal straps according to this method of the present invention using the electroless plating process, the activator material can be applied to the entire surface of the protected wafer, and the plating material applied to only the areas of the activated surface in which the terminal straps are to be formed. The plating material can be applied to the activated surface through a mask covering the area not to be coated with the metal. Also, the activating material can be applied through a suitable mask to the areas of the protected wafer in which the terminal straps are to be formed, and the plating material applied to the activated areas. After the terminal straps are formed on the wafer, any masking material is removed and the wafer is diced to separate the individual semiconductor devices.

Figure 8:
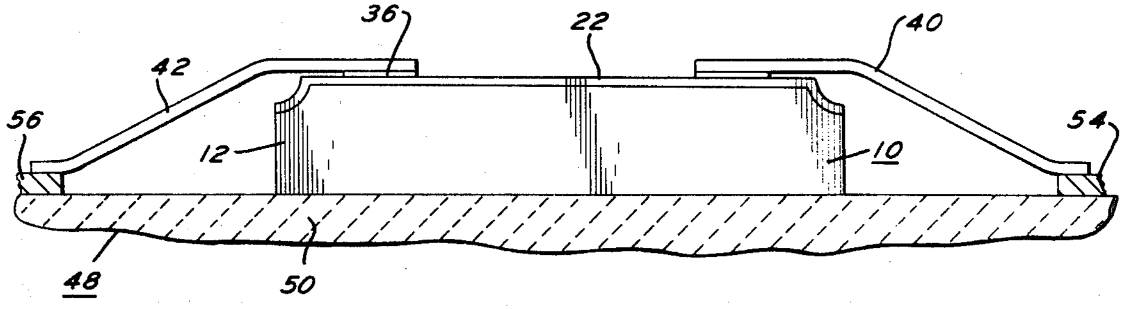
FIG. 8 is a sectional view taken along line 8—8 of FIG. 4.

Referring to FIGS. 4 and 8, there is shown a semiconductor device 10 of the present invention mounted on a microcircuit assembly 48. Microcircuit assembly 48 comprises a plate 50 of an electrical insulating material having circuit paths 52, 54 and 56 of an electrically conductive metal coated on the surface thereof. The circuit paths 52, 54 and 56 are coated with a layer of solder. The semiconductor device 10 is seated on the plate 50 intermediate the circuit paths 52, 54 and 56. The free ends of the terminal straps 38, 40 and 42 are bonded to the circuit paths 52, 54 and 56 respectively by the solder coated on the circuit paths. To mount the semiconductor device 10 on the microcircuit assembly, it is only necessary to place the semiconductor device 10 on the plate 50 with the terminal straps 38, 40 and 42 extending over their respective circuit paths 52, 54 and 56. The ends of the terminal straps are then pressed down against the circuit paths by means of a heated tool to solder the terminal straps to the circuit paths. By using a properly shaped tool, all of the terminal straps can be simultaneously pressed down against and soldered to the circuit paths. Similarly, the semiconductor device 10 can be mounted in an individual housing by placing the semiconductor device on the base header of the housing and soldering or welding the terminal straps 38, 40 and 42 to terminal wires extending through the base header. Thus, the construction of the semiconductor device 10 not only permits the terminated semiconductor device to be manufactured with greater ease and at reduced cost, but also provides for greater ease of mounting in the semiconductor device either in a housing or on a microcircuit assembly.

As shown in FIG. 8, the terminal straps are bent downwardly across the sides of the disc 12 when the terminal straps are secured to the circuit paths. By providing the grooves 14a and 14b at the top corners of the side edges of the disc which are coated with the electrically insulating oxide film 22, contact between the terminal straps and the disc 12 is prevented. Thus, the semiconductor device cannot be shorted out during the mounting of the device on the microcircuit assembly or in a housing.

Although the semiconductor device 10 is shown and described as being a transistor, it can be any type of semiconductor device, such as a diode, a controlled rectifier or an integrated circuit. An integrated circuit includes a plurality of semiconductor elements formed in a disc of semiconductor material. Terminal straps are secured to one or more electrodes of one or more of the semiconductor elements by the method of the present invention, and the remaining electrodes are interconnected by conducting circuit paths on the disc. Also, although the disc 12 of the semiconductor device 10 is shown and described as being square, the disc can be rectangular, circular or any other shape into which the wafer 44 can be diced, either by the dicing method described or any other well known dicing method.

The present invention may be embodied in other specific forms without departing from the spirit or essential attributes thereof and, accordingly, reference should be made to the appended claims, rather than to the foregoing specification as indicating the scope of the invention.

We claim:

1. A semiconductor article having a plurality of transistors incorporated therein comprising a flat wafer of a semiconductor material of one conductivity type, a plurality of spaced base areas in one surface of said wafer and arranged in a plurality of spaced parallel rows with each row containing a plurality of said base areas, said base areas being of a conductivity type opposite to that of the material of said wafer so that each base area provides a P-N junction with the material of the wafer, a plurality of emitter areas of the same conductivity type as the material of said wafer in said surface of the wafer, each of said emitter areas being completely within a separate one of said base areas so as to provide a P-N junction therewith, a plurality of spaced collector areas of the same conductivity type as the material of the wafer in said surface of the wafer, said collector areas being arranged in spaced parallel rows which alternate with the rows of the base areas with each of said collector areas being adjacent to but spaced from a separate one of said base areas, a separate electrode of an electrically conductive metal on at least a portion of each of said base areas, emitter areas and collector areas, a protective oxide film covering said surface of the wafer except for the electrodes, and a separate flat terminal strap of an electrically conductive metal secured at one end to each of said electrodes, said terminal straps all lying in a plane juxtaposed and parallel to the said surface of the wafer with the longitudinal axes of the terminal straps secured to the base area electrodes being out of alignment with the longitudinal axes of the terminal straps secured to the emitter area electrodes and the collector area electrodes, and the longitudinal axes of the terminal straps secured to the emitter area electrodes also being out of alignment with the longitudinal axes of the terminal straps of the collector area electrodes, and each of the terminal straps being secured to its respective electrode along a flat surface of the strap.

2. A semiconductor article in accordance with claim 1 in which each of the collector terminal straps extends along a line between its adjacent base terminal strap and emitter terminal strap, and the free end portion of each of the collector terminal straps extends between and overlaps the free end portions of its non-adjacent base terminal strap and emitter terminal strap.

3. A semiconductor article in accordance with claim 2 in which the wafer has a separate groove in its said surface extending between each row of collector electrodes and the non-adjacent row of base electrodes and emitter electrodes, the protective oxide film covers the surface of said grooves and the terminal straps extend over the grooves.

* * * * *